(12) United States Patent
Neoh

(10) Patent No.: US 6,395,086 B1
(45) Date of Patent: May 28, 2002

(54) SHIELD FOR WAFER STATION

(75) Inventor: Soon Ee Neoh, Singapore (SG)

(73) Assignee: Chartered Semiconductor Manufacturing Pte Ltd, Singapore (SG)

( * ) Notice: Subject to any disclaimer, the term of this patent is extended or adjusted under 35 U.S.C. 154(b) by 0 days.

(21) Appl. No.: 08/445,590

(22) Filed: May 22, 1995

Related U.S. Application Data

(63) Continuation of application No. 08/044,932, filed on Apr. 8, 1993, now abandoned.

(51) Int. Cl.⁷ ............................................. B05C 11/02
(52) U.S. Cl. .................... 118/52; 118/56; 118/301; 118/319; 118/320; 118/406; 118/409; 118/416
(58) Field of Search .......................... 118/52, 320, 56, 118/416, 301, 504, 406, 45, 319, 409; 427/240, 425, 352; 239/288, 288.5

(56) References Cited

U.S. PATENT DOCUMENTS

| | | | | |
|---|---|---|---|---|
| 4,393,807 A | * | 7/1983 | Fujimura et al. | 118/52 |
| 4,510,176 A | * | 4/1985 | Cuthbert et al. | 118/52 |
| 4,822,639 A | * | 4/1989 | Fujii et al. | 118/52 |
| 4,838,979 A | * | 6/1989 | Nishida et al. | 118/52 |
| 4,982,694 A | * | 1/1991 | Moriyama | 118/52 |
| 5,075,256 A | * | 12/1991 | Wang et al. | |
| 5,116,250 A | * | 5/1992 | Sago et al. | 118/52 |
| 5,529,626 A | * | 6/1996 | Stewart | 118/320 |

FOREIGN PATENT DOCUMENTS

| | | | | |
|---|---|---|---|---|
| JP | 56-104440 | * | 8/1981 | 118/52 |
| JP | 61-239625 | * | 10/1986 | 118/52 |
| JP | 64-15925 | * | 1/1989 | 118/52 |
| JP | 64-77126 | * | 3/1989 | 118/320 |
| JP | 64-81223 | * | 3/1989 | 118/320 |
| JP | 2-198131 | * | 8/1990 | 118/52 |
| JP | 4-14813 | * | 1/1992 | 118/52 |
| JP | 4-74412 | * | 3/1992 | 118/52 |
| JP | 4-174848 | * | 6/1992 | 118/52 |

* cited by examiner

Primary Examiner—Sean Vincent
(74) Attorney, Agent, or Firm—George O. Saile; Rosemary L. S. Pike; William Robertson

(57) ABSTRACT

An improved shield for preventing the contamination of a wafer back from resist is combined with process steps that further prevent this contamination. The shield is located where vortex like air currents could otherwise deposit the resist vapor on the wafer back. The shield has the general shape of a cylinder that is open at the top and closed at the bottom. The bottom provides an attachment to a conventional part of the wafer coater and also forms part of the shield. The sides are arranged to extend close to the wafer back at a radius just less than the radius of the wafer. In the improved process, the spindle of the wafer chuck is not rotated at more than 1200 revolutions per minute in any of the wafer spinning operations, and the conventional step of washing the wafer back with a solvent is performed only at the end of the other operations.

8 Claims, 3 Drawing Sheets

SHIELD FOR WAFER STATION

RELATED APPLICATIONS

This application is a continuation of application Ser. No. 08/044,932 filed Apr. 8, 1993 now abandoned.

FIELD OF THE INVENTION

This invention relates to apparatus and an associated process for manufacturing a semiconductor wafer. More specifically, this invention relates to apparatus with a shield for the back of the wafer to prevent contamination by the photoresist and it relates to a process that is used with the shield.

INTRODUCTION

Processes and apparatus for carrying out manufacturing steps on semiconductor wafers are well known, but it will be helpful to review the features and terminology that particularly apply to this invention. The wafer is held in a chuck while semiconductor devices are formed in an array on the exposed surface of the wafer. In one of the steps, the exposed surface of the wafer is coated with a photosensitive resist. The other surface is called the wafer back or more simply the back.

There is a known problem in this art that the wafer back can become contaminated with the resist. This contamination is more troublesome as devices on the wafer are made smaller.

The coating step may be repeated at several steps of the overall process, and back contamination can be carried into the coating station. Wafer back contamination can also be attributed to the structure of the coating apparatus and to the process for using the apparatus.

THE PRIOR ART

U.S. Pat. No. 4,982,694 shows a wafer 11, a wafer chuck 10 and a nozzle 50 for spraying a solvent on the back side of the wafer. This patent also discusses the speed of the spinner.

U.S. Pat. No. 5,116,250 spins the wafer in the range of 1000 to 6000 rpm, uses the air flow through the apparatus to help remove the vapor, and has a form of mask for the wafer back.

U.S. Pat. Nos. 5,075,256, 4,393,807 and 4,510,176 also discuss the problem.

SUMMARY OF THE INVENTION

One feature of this invention is an improved shield that protects the wafer back from the resist vapor. The shield is located where vortex like air currents could otherwise deposit the resist vapor on the wafer back.

The shield has the general shape of a cylinder that is open at the top. The bottom provides an attachment to a conventional part of the wafer coater and also forms part of the shield. The sides are arranged to extend close to the wafer back at a radius just less than the radius of the wafer. A suitable separation is no greater than 2.0 mm and the overhang of the wafer beyond the cylindrical sides of the shield is 4 to 6 mm.

In one feature of the improved process, the spindle of the wafer chuck is not rotated at more than 1200 revolutions per minute in any of the wafer spinning operations. As is known, limiting the speed reduces the amount of resist vapor produced while the wafer is being spun.

In another feature of the improved process, the conventional step of washing the wafer back with a solvent is performed only at the end of the other steps.

Other features and advantages of the invention will be understood from the description of the preferred embodiment.

THE DRAWING

THE PREFERRED EMBODIMENT

Figure 1:
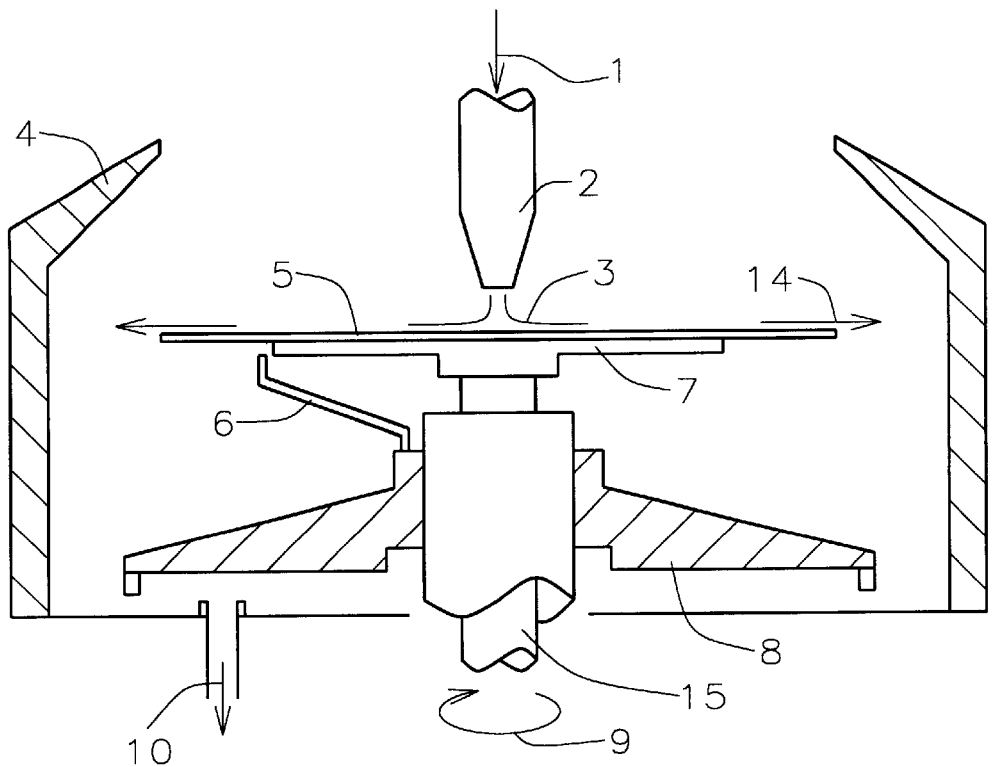
FIG. 1 is a vertical sectional drawing of a conventional station for applying a photoresist coating to a wafer.

Conventional Components of the Station—FIG. 1

This apparatus is conventional and is shown schematically. A chuck 7 holds the wafer 5. A spindle 15 is mounted in a bearing support and rotates the chuck, as represented by a circular arrow 9. A nozzle 2 directs the flow of the resist. An arrowed line 1 represents the flow of resist into the nozzle and the flow out of the nozzle. Lines 3 represent the flow of resist onto the wafer. Arrowed lines 14 show the flow of the resist across the wafer (from the centrifugal action of the rotating wafer).

A catchcup bowl structure having two parts 4 and 8 surrounds the other parts to contain the resist that escapes from the surface of the wafer. Part 8 will be called the lower part and part 4 will be called the outer part. The bowl structure also has a lower floor that supports the outer part 4. Air is pulled into the bowl structure by the spinning of the wafer, and a controlled exhaust 10 in the floor of the bowl structure permits this air and some of the escaped resist to flow out of the coater structure, as arrow 10 represents.

A back rinse nozzle 6 dispenses solvent against the wafer back for removing the resist deposit.

The Process—Conventional Steps

The known process dispenses a very precise volume and with a precise pressure through nozzle 2 onto the center of wafer 5. The resist spreads as shown by lines 3 while the wafer or substrate 5 is spinning. When a predetermined volume has been dispensed (commonly 3.5 to 4.5 cc) the spindle accelerates to high rpm. The photoresist spreads uniformly, as represented by arrow 14, to a thickness that is controlled at least in part by the spindle speed.

The conventional coater process also includes a wafer back rinsing step. In another step, solvent is dispensed at the edge of the wafer while the spindle has a high rpm to clear the edge of the wafer.

Figure 2:
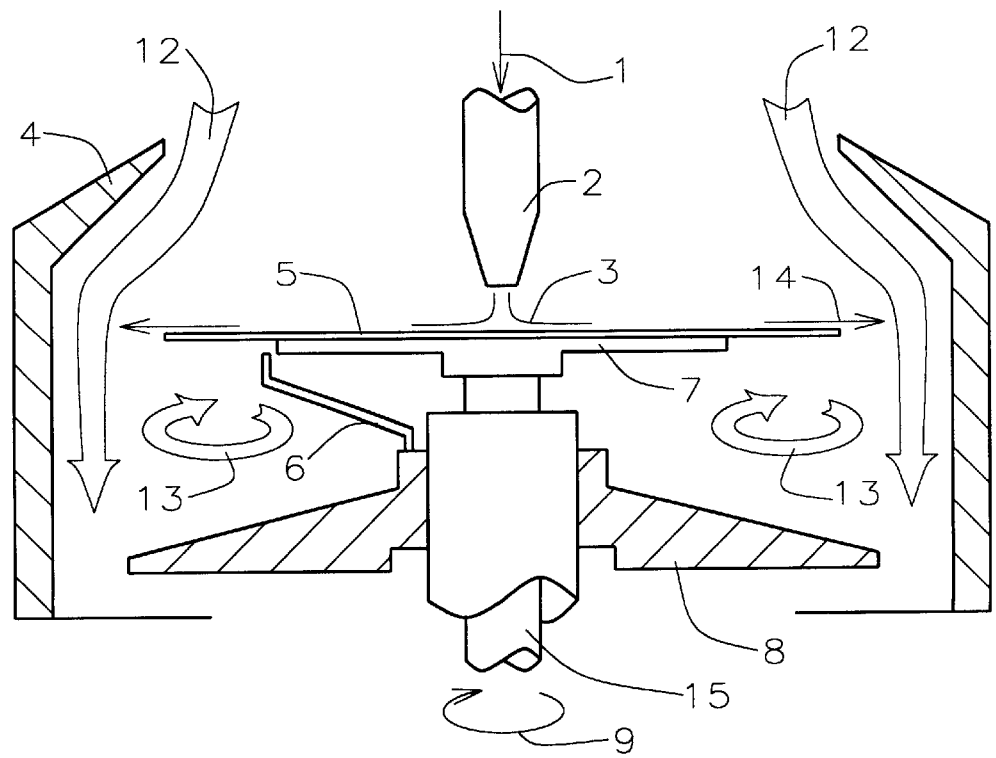
FIG. 2 is a similar vertical section drawing with arrows that show the flow of air through the apparatus and a vortex like air current that contributes to wafer back contamination.
Figure 3:
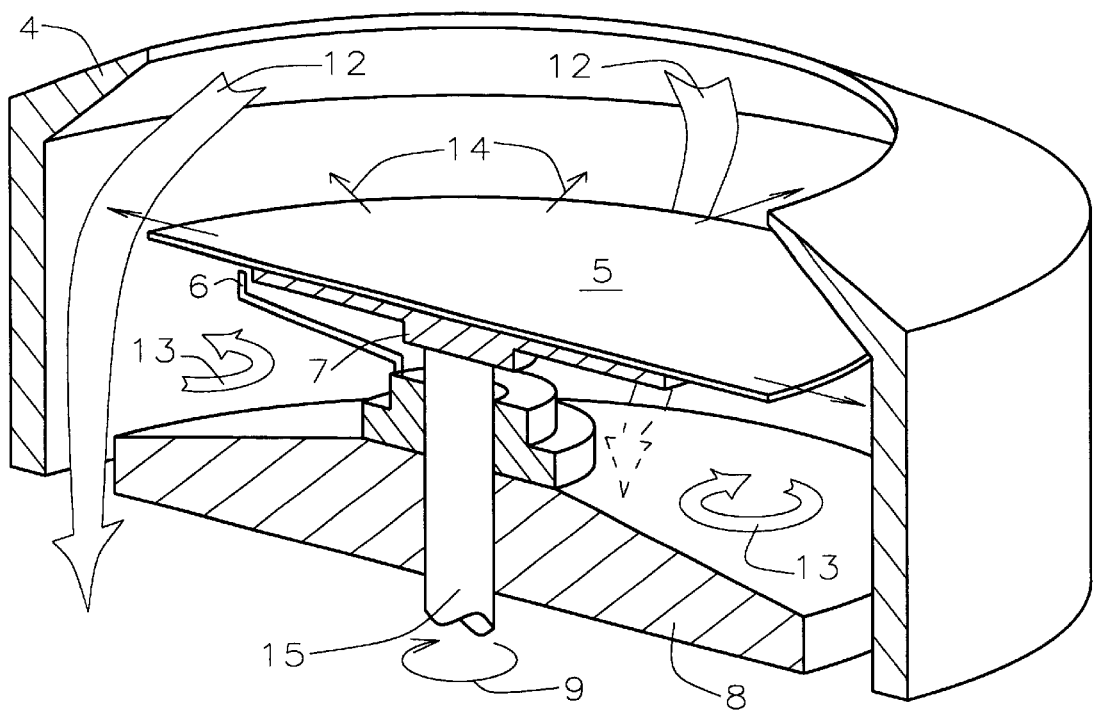
FIG. 3 shows a vertical sectional drawing in an isometric view with arrows that show the flow of air through the apparatus and the vortex action.
Figure 4:
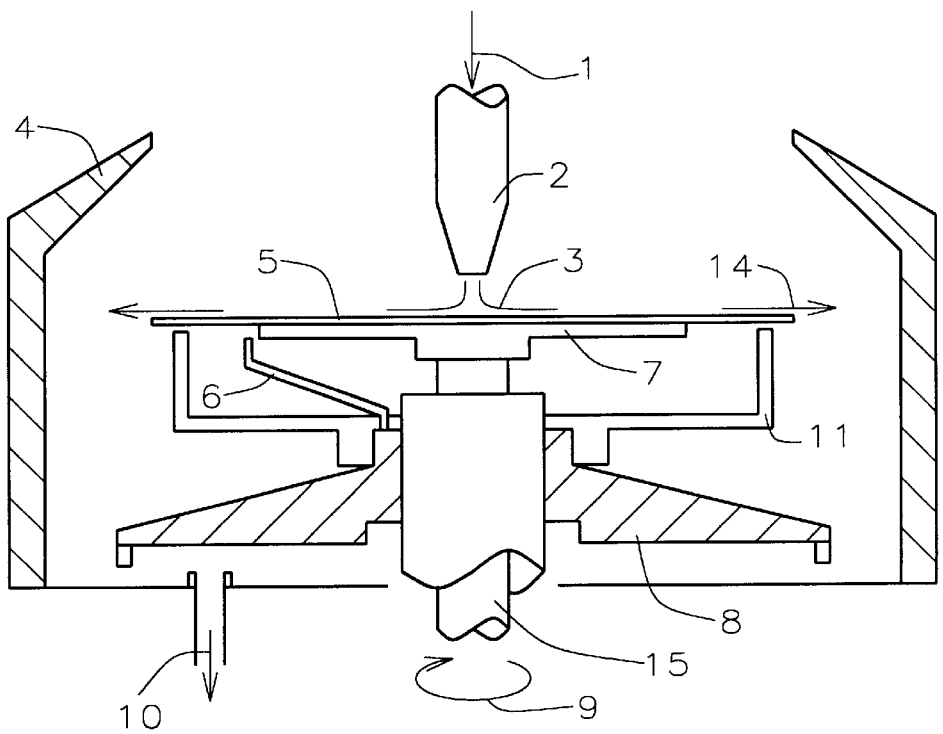
FIG. 4 shows the preferred embodiment of a resist coater with an improved shield.
Figure 5:
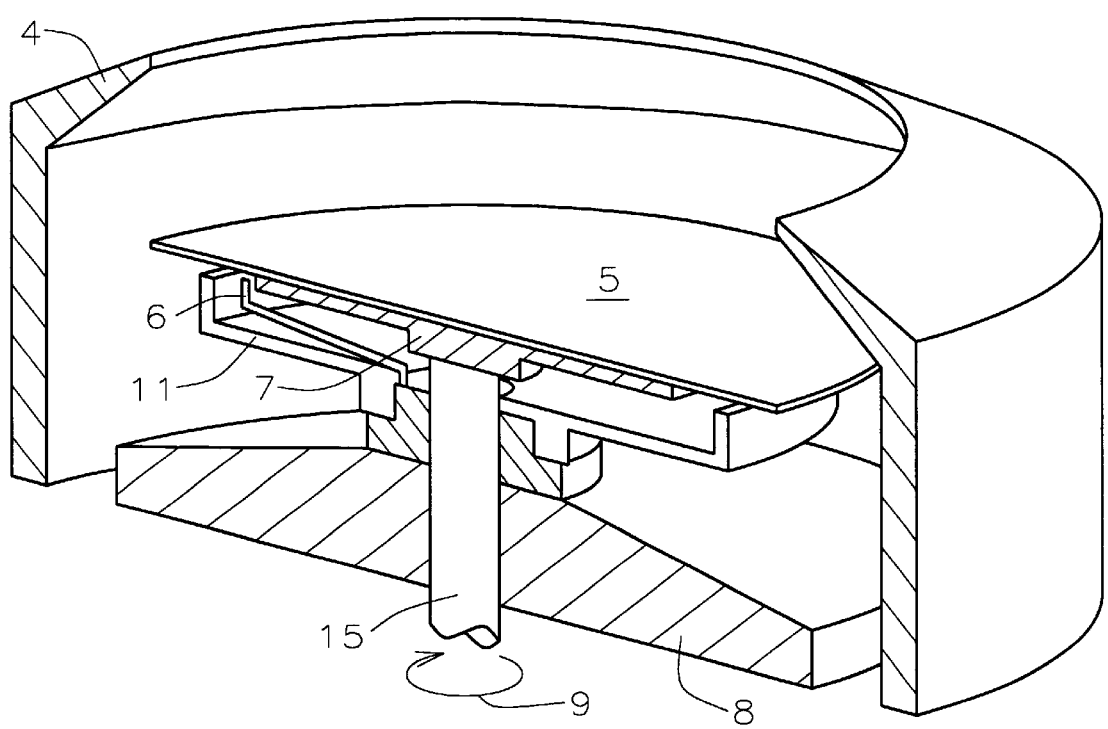
FIG. 5 is an isometric drawing of the coater and the shield of FIG. 4.

The Problems of the Prior Art—FIG. 2

Broad arrows 12 show the flow of air into the shield structure. Broad arrows 13 show a vortex or vortex-like current that forms in response to the high speed of the spindle, represented by an arrow 9, and the inflowing air along path 12. Photoresist 14 is thrown out by centrifugal action and it will break up into a mist that is carried by the vortex. The vortex carries some of the mist to the wafer back and it is deposited there.

Some of the components in FIG. 2 have not been referred to in this description but will be understood from the description of the corresponding components in FIG. 1.

The Improved Shield

The shield for protecting the back of the wafer is in the shape of a generally cylindrical cup that is open at the top. The bottom wall is adapted to be attached to part 8 of the catchcup bowl 4, 8. The shield diameter is less than the wafer diameter by a suitable distance so a maximum amount of the wafer back surface is inside the shield but the edge of the wafer overhangs the open end of the cup sufficiently to form a seal. The preferred overhang is 4–6 mm.

A gap is provided between the upper rim of the shield 11 and the wafer 5 so the wafer can rotate with respect to the shield. The value of the gap is critical and a suitable gap is 1.8 to 2.2 mm.

As a further advantage, the shield enhances the back rinsing action.

The Associated Process

The wafer coating apparatus is used according to a process that helps to limit the effect of the vortex. In the step of dispensing the resist onto the wafer, the spindle 15 is driven at a relatively low spin speed, preferably 0.8 to 1.2 rpm. The wafer back rinse operation is performed only at the final stage.

For the step of spreading the resist, the spindle is conventionally driven at a speed of 4000 to 6000 rpm. It is spun again at this speed for the step of dispensing solvent at the edge of the wafer. The prior art has also suggested reducing the spin speed to reduce the vapor that is formed. I have found that the spindle speed should be limited to a maximum of 1200 rpm for these high speed steps but does not need to be less than about 800 rpm.

OTHER EMBODIMENTS

Those skilled in the art will adapt the process and structure to specific environments with appropriate modifications within the skill of the art and the intended scope of the claims.

What is claimed is:

1. Semiconductor wafer coating apparatus having a chuck for holding a thin circular wafer with one surface of the wafer exposed to receive a coating of a material, the opposite surface being called the wafer back, means including a spindle for spinning the chuck and the wafer, means for dispensing the material onto the exposed surface of the wafer while the spindle is rotating whereby the material flows radially outward across the surface of the wafer and thereby coats the wafer, the material being subject to being slung off from the wafer and to thereby contaminating the wafer back, and a bowl structure with a lower part through which the spindle passes and a side wall part surrounding at least the plane of the wafer, wherein the improvement comprises,
   a shield for the wafer back having, as a unitary structure,
   a thin, flat, lower part adapted for attachment to the bowl lower part to be located between the bowl lower part and the chuck,
   and a cylindrical part extending from the shield lower part, at a radius slightly less than the radius of the wafer, to about the wafer back,
   whereby improved protection against the deposit of vapor of said material on the wafer back is provided.

2. The apparatus of claim 1 wherein the material is a resist.

3. The apparatus of claim 2 wherein air flows through the bowl structure and removes most of the resist vapor from the apparatus but in the absence of the shield would deposit some of the resist vapor on the wafer back, and wherein the shield is located to protect the wafer back from resist vapor carried in the air flowing through the bowl structure.

4. The apparatus of claim 3 wherein air flows through the bowl structure with vortex containing currents and wherein the wafer back is subject to the deposition of resist vapor, and the shield is located to protect the wafer back from resist vapor carried in the vortex containing currents.

5. The apparatus of claim 4 wherein less resist vapor is created by spinning the wafer at a lower speed and the means for spinning the wafer while the material flows across the surface of the wafer has means for spinning the wafer at a speed not greater than 1200 revolutions per minute for limiting the resist vapor.

6. The apparatus of claim 5 wherein the shield cylindrical part extends to not more than 2.0 mm from the wafer back.

7. The apparatus of claim 6 wherein the diameter of the shield cylindrical part is selected for the wafer to extend beyond the shield cylindrical part by 4 to 6 mm.

8. The apparatus of claim 1 wherein said lower part is disk shaped.

\* \* \* \* \*